(12) United States Patent
Yoshimura (10) Patent No.: US 11,462,434 B2
(45) Date of Patent: Oct. 4, 2022

(54) TAPE MOUNTER AND MERCHANDISE MANAGEMENT WAREHOUSE

(71) Applicant: DISCO CORPORATION, Tokyo (JP)

(72) Inventor: Hiroshi Yoshimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 95 days.

(21) Appl. No.: 17/061,983

(22) Filed: Oct. 2, 2020

(65) Prior Publication Data

US 2021/0111061 A1  Apr. 15, 2021

(30) Foreign Application Priority Data

Oct. 9, 2019 (JP) .............................. JP2019-185846

(51) Int. Cl.
*H01L 21/683* (2006.01)
*H01L 21/78* (2006.01)

(52) U.S. Cl.
CPC .......... *H01L 21/6836* (2013.01); *H01L 21/78* (2013.01); *H01L 2221/68327* (2013.01)

(58) Field of Classification Search
CPC ................ H01L 21/6836; H01L 21/78; H01L 2221/68327; H01L 21/67132; H01L 21/6835; H01L 21/67294; B65C 9/0006; B65C 9/18; B65H 37/02; B65H 2553/52; B65H 2701/377
USPC ...................................................... 438/113
See application file for complete search history.

(56) References Cited

U.S. PATENT DOCUMENTS

| 6,201,474 | B1 * | 3/2001 | Brady | .............. | G06K 19/07758 |
| | | | | | 235/487 |
| 6,549,371 | B1 * | 4/2003 | Giles | ..................... | G11B 15/16 |
| | | | | | 360/137 |
| 7,504,949 | B1 * | 3/2009 | Rouaix | .................. | G06Q 10/06 |
| | | | | | 340/572.1 |
| 8,201,329 | B2 * | 6/2012 | Nakamura | ......... | H05K 13/0478 |
| | | | | | 29/854 |

FOREIGN PATENT DOCUMENTS

JP   2016008104 A   1/2016

* cited by examiner

*Primary Examiner* — Vu A Vu
(74) *Attorney, Agent, or Firm* — Greer Burns & Crain, Ltd.

(57) ABSTRACT

A tape mounter includes at least two storage units storing respective tape sets therein, a reader for reading information of the tape sets stored in the respective storage units from RFIDs attached to tubes around which the tape sets are wound as tape rolls, the storage units having shafts inserted in the tubes and being disposed such that they are spaced from the reader by respective different distances, a time measuring unit for measuring reading times spent until the reader receives radio waves generated and transmitted by the RFIDs and reads the information of the tape sets represented by the radio waves, a mapping table containing positions of the storage units corresponding to the respective reading times, and a recognizing section for checking the reading times against the mapping table, and recognizing the positions of the storage units and types of the tape sets.

7 Claims, 4 Drawing Sheets

TAPE MOUNTER AND MERCHANDISE MANAGEMENT WAREHOUSE

BACKGROUND OF THE INVENTION

Field of the Invention

The present invention relates to a tape mounter for affixing a tape to a workpiece such as a semiconductor wafer, and a merchandise management warehouse for managing merchandise.

Description of the Related Art

As disclosed in JP2016-008104A, for example, a tape mounter for forming a work set where a dicing tape is affixed to a ring frame having an opening in which a wafer can be disposed and to the wafer disposed in the opening, combining the ring frame and the wafer integrally with each other is occasionally required to change types of dicing tapes to be affixed depending on devices formed on a face side of the wafer.

Therefore, the tape mounter needs to have at least two types of dicing tapes available for use, and hence has at least two tape storage boxes. Each of the tape storage boxes houses therein a tape set as a tape roll including a dicing tape corresponding in shape to a workpiece and an elongate protective film to which the dicing tape is affixed.

A tape gripper grips a portion of the tape set hanging from an outer circumference of the tape roll, pulls out the tape set from the tape storage box, and trains the tape set around a plurality of rollers to place the tape set in a state where it can be affixed to the ring frame and the wafer.

SUMMARY OF THE INVENTION

For changing the types of dicing tapes on the tape mounter disclosed in JP2016-008104A, an operator specifies a tape storage box storing the type of dicing tape that the operator is desirous of. Then, the tape gripper is moved to a position of the specified tape storage box, and grips an end of the tape set stored in the specified tape storage box and trains the tape set around the rollers to place the tape set in the state where it can be affixed to the ring frame and the wafer. It is thus necessary for the operator to grasp in advance the types of dicing tapes stored in the respective tape storage boxes.

Furthermore, when a dicing tape is to be affixed to a wafer, a rolling roller may be strongly pressed against the dicing tape and the dicing tape may be affixed to the wafer while being pulled along depending on the type of the dicing tape. Since different types of dicing tapes are affixed in different ways, processing conditions to be met in affixing those dicing tapes include the types of dicing tapes.

It is therefore an object of the present invention to provide a tape mounter that is capable of locating on its own the type of a dicing tape that is the same as the type of a dicing tape included in processing conditions for affixing the dicing tape, from among a plurality of tape storage boxes even if the operator does not specify one of the tape storage boxes that stores the desired type of the dicing tape, and of causing a gripper to place the dicing tape in a state where it can be affixed to a wafer and a ring frame in the tape mounter. Another object of the present invention is to provide a merchandise management warehouse that allows the operator to quickly locate a desired piece of merchandise from among merchandise stored in a plurality of boxes arrayed in the warehouse.

In accordance with an aspect of the present invention, there is provided a tape mounter for affixing a tape to a workpiece, including: at least two storage units each storing a tape set that includes a tape having a base corresponding in shape to the workpiece and an adhesive layer formed on a surface of the base, and an elongate protective film for protecting the adhesive layer, the tape set wound around a tube as a tape roll, the tube having a RFID storing information of the tape set, each of the storage units having a shaft inserted in the tube; a plurality of rollers around which the tape set pulled from the tape roll stored in each of the storage units is trained to peel off the tape from the protective film before the tape is affixed to the workpiece; a reader for reading the information stored in the RFID of each of the tape sets stored in the storage units, the reader being spaced from the storage units by respective different distances; a time measuring unit for measuring reading times spent until the reader receives radio waves generated and transmitted by the RFIDs stored in the storage units in response to radio waves generated and transmitted by the reader and reads the information of the tape sets represented by the radio waves; a mapping table containing positions of the storage units corresponding to the respective reading times; and a recognizing section for checking the reading times spent until the reader receives the radio waves representing the information of the tape sets from the RFIDs of the tape rolls stored in the respective storage units, against the mapping table, and recognizing the positions of the storage units and types of the tape sets stored in the storage units.

In accordance with another aspect of the present invention, there is provided a merchandise management warehouse including: a reader for reading information of RFIDs attached to respective pieces of merchandise; a plurality of boxes storing the respective pieces of merchandise therein and disposed such that the RFIDs attached to the respective pieces of merchandise stored therein are spaced from the reader by respective different distances; a time measuring unit for measuring reading times spent until the reader receives radio waves generated and transmitted by the RFIDs in response to radio waves generated and transmitted by the reader and reads information of the pieces of merchandise represented by the radio waves generated and transmitted by the RFIDs; a mapping table containing positions of the boxes corresponding to the respective reading times; and a recognizing section for checking the reading times spent until the reader receives the radio waves representing the information of the pieces of merchandise from the RFIDs of the pieces of merchandise stored in the respective boxes, against the mapping table, and recognizing the positions of the boxes and the information of the pieces of merchandise stored in the boxes.

The tape mounter according to the aspect of the present invention is arranged as described above. Simply with the operator setting processing conditions for affixing the tape in the tape mounter, the tape mounter can operate on its own to recognize a tape set of the same type as the tape type included in the processing conditions among the storage units, and move a tape set gripper to a recognized one of the storage units, causing the tape set gripper to place the tape set of a desired type in position in the tape mounter. Consequently, the operator is not required to grasp the types of the tape sets stored in the storage units and the positions of the storage units. Since it is possible for the tape mounter to switch to the tape set of the tape type included in desired processing conditions without requiring the operator to specify the position of the storage unit that stores the tape set, the operator is able to work more efficiently and is less subjected to burdens at work.

The merchandise management warehouse according to the other aspect of the present invention is arranged as described above. When the operator is to find a desired piece of merchandise in the warehouse among the boxes storing the respective pieces of merchandise, the recognizing section recognizes the desired piece of merchandise among the boxes. It is thus possible for the operator to quickly locate the desired piece of merchandise among the pieces of merchandise stored in the respective boxes on the basis of the information recognized by the recognizing section.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
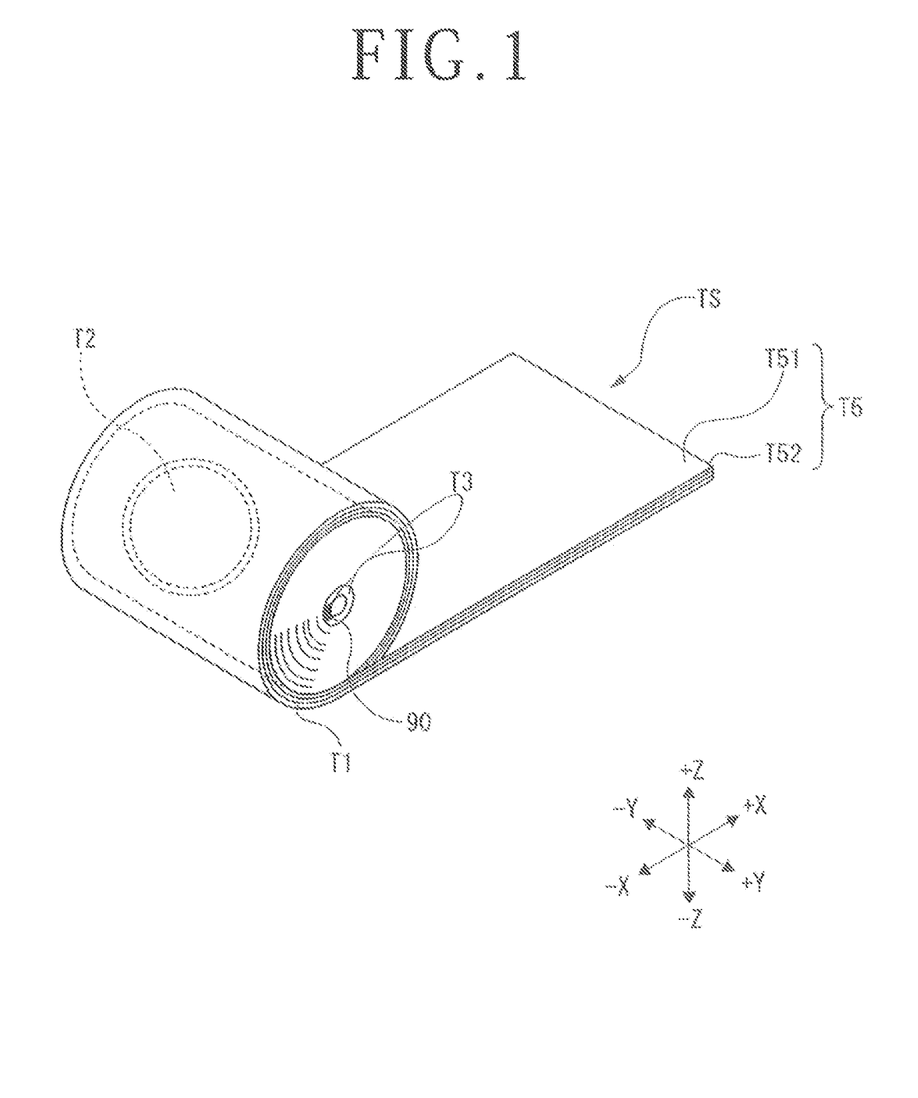
FIG. 1 is a perspective view of an example of a tape set wound in a tape roll.

Tape Mounter:

A tape set TS illustrated in FIG. 1 is of a structure where a web-shaped tape T5 including a base T51 and an adhesive layer T52 formed on a surface of the base T51 and an elongate protective film T1 for protecting the adhesive layer T52 are affixed to each other. The base T51 of the web-shaped tape T5 is made of polyethylene, for example, and the adhesive layer T52 is made of an ultraviolet (UV)-curable adhesive of an acrylic base resin whose adhesive power is lowered when it is cured upon exposure to UV rays, for example. However, the base T51 and the adhesive layer T52 of the web-shaped tape T5 are not necessarily limited to above details.

The web-shaped tape T5 is precut into a plurality of circular areas that are commensurate in diameter with an opening of a ring frame F (see FIG. 2) shaped as an annular plate to which they are to be affixed. The circular areas act as circular tapes T2 each corresponding in shape to a circular workpiece W to which they are to be affixed. The circular tapes T2 are affixed to the protective film T1 at equal spaced intervals along longitudinal directions of the web-shaped tape T5, i.e., X-axis directions in FIG. 1.

As illustrated in FIG. 1, the tape set TS is wound in a tape roll around a tube T3 with the circular tapes T2 on an inner side of the tape set TS.

The tube T3 that supports the tape roll of the tape set TS has a radio frequency identifier (RFID) 90 as an RF tag storing information of the tape set TS. The RFID 90 and a reader 94 (FIG. 2), to be described later, for reading information stored in the RFID 90 exchange information about the type of the tape set TS by way of short-range wireless communication based on electromagnetic induction, for example.

Figure 2:
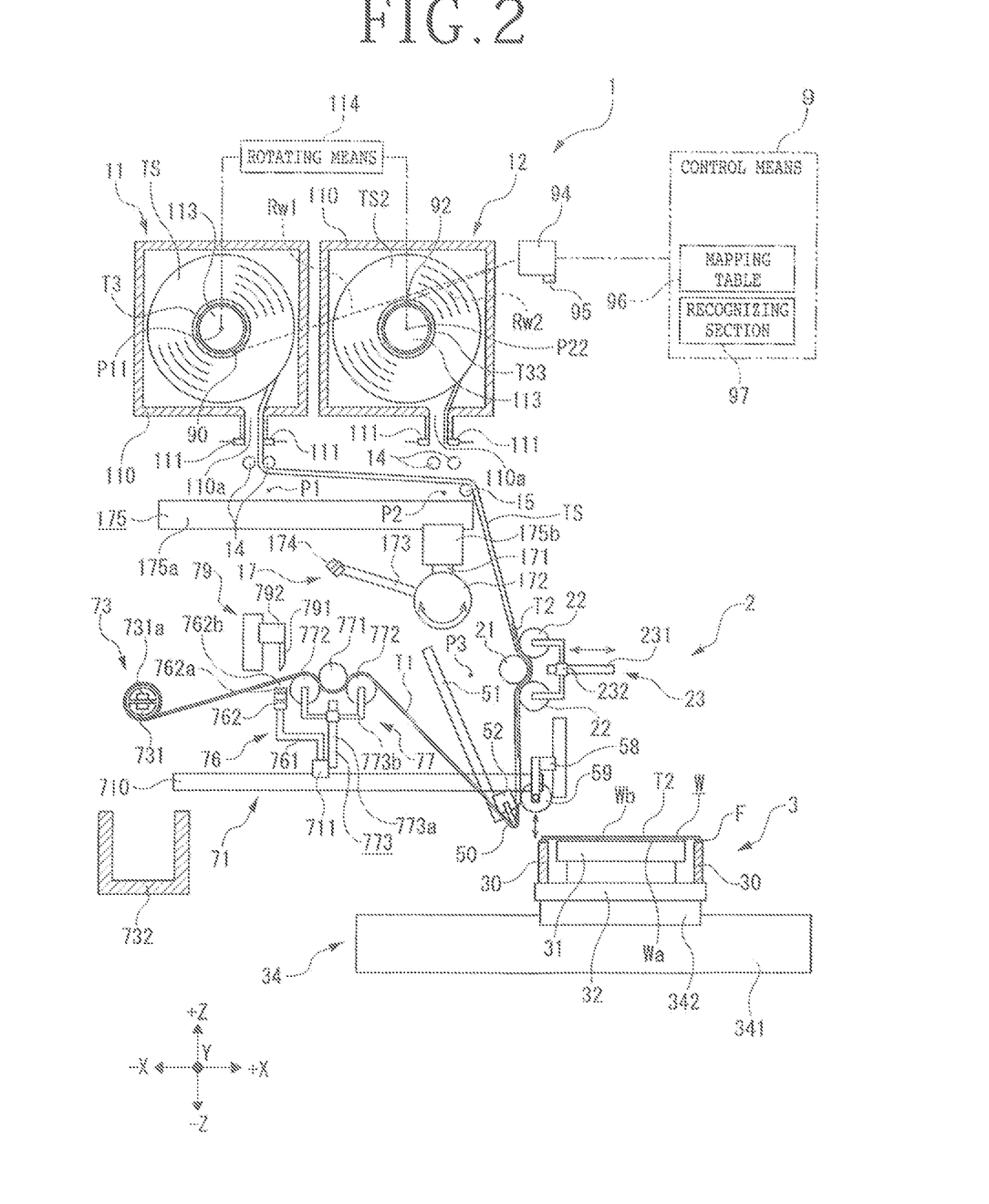
FIG. 2 is a schematic cross-sectional view of a structural example of a tape mounter according to an embodiment of the present invention.

As illustrated in FIG. 2, a tape mounter 1 according to the present embodiment is an apparatus that includes a first storage unit 11 and a second storage unit 12 that have respective shafts 113 inserted in respective tubes T3 of tape rolls of tape sets TS, and that trains the tape set TS drawn from the tape roll, which is of one of various types, stored in the first storage unit 11 or the second storage unit 12, around a plurality of rollers and affixes a circular tape T2 peeled from the protective film T1 to the workpiece W and the ring frame F.

The workpiece W may be, for example, a circular semiconductor wafer made of a base material of silicon or the like, but is not limited thereto. The workpiece W has a reverse side Wb oriented upwardly, i.e., in a +Z direction, that acts as an affixed surface to which the tape T2 is affixed. The workpiece W has a face side Wa opposite the reverse side Wb, the face side Wa having a plurality of areas demarcated by a plurality of projected dicing lines and a plurality of devices such as integrated circuits (ICs), large scale integration (LSI) circuits, or the like formed in the respective demarcated areas. In the example illustrated in FIG. 2, the workpiece W is held on a holding unit 3 such as a table or the like.

According to the present embodiment, the storage units that store therein the tape sets TS of various types as tape rolls include two storage units, i.e., the first storage unit 11 and the second storage unit 12. However, the storage units may include three or more storage units. Since the first storage unit 11 and the second storage unit 12 are structurally identical to each other, structural details of the first storage unit 11 will be described below.

The first storage unit 11 has a case 110 that stores the tape set TS wound in a roll. The case 110 includes a bottom wall having an opening 110a defined therein through which the tape set TS passes. The first storage unit 11 should preferably be made of a synthetic resin or the like that does not obstruct wireless communication, for example. A leading end detector 111 for detecting a leading end of the tape set TS is mounted on a lower end of the opening 110a. The leading end detector 111 may be, for example, a transmissive-type optical sensor including a light detector and a light emitter, or the like.

The shaft 113 that is inserted in the tube T3 of the tape roll of the tape set TS is disposed in the case 110. The shaft 113 is rotatable about a rotational axis extending in Y-axis directions by rotating means 114 including an electric motor, etc.

An openable and closable lid, not illustrated, is disposed on a side of the case 110 that is closer to the viewer of FIG. 2.

It is assumed, for example, that the tape set TS stored in the first storage unit 11 is referred to as a tape set TS of type 1, and the tape set stored in the second storage unit 12 is referred to as a tape set TS2 of type 2. The tape set TS2 of type 2 has its base T51 made of polystyrene whereas the tape set TS of type 1 has its base T51 made of polyethylene. Furthermore, a tube T33 that supports the tape roll of the tape set TS2 of type 2 has an RFID 92 as an RF tag storing information of the tape set TS2.

The first storage unit 11 is disposed in a position referred to as a first disposed position P11 whereas the second storage unit 12 is disposed in a position referred to as a second disposed position P22.

Respective pairs of guide rollers 14 are disposed directly below the openings 110a of the cases 110 of the first and second storage units 11 and 12. The pairs of the guide rollers 14 guide the respective tape sets TS and TS2 pulled out of the cases 110 to travel toward a tape set transfer unit 17 while keeping them under tension.

In the illustrated example, a guide roller 15 is disposed closely to the pair of guide rollers 14 beneath the second storage unit 12 for guiding a selected one of the tape sets TS and TS2 toward a delivery unit 2 that delivers the tape set in a desired direction toward a position below a peel plate 50 to be described later.

The tape set transfer unit 17 illustrated in FIG. 2 includes a rotating mechanism 172 connected to a lower end of a support member 171, an arm 173 connected to the rotating mechanism 172, a tape set gripper 174 in the form of a clamp or the like disposed on a distal end of the arm 173, and a sliding mechanism 175 for slidingly moving the support member 171 in the X-axis directions. The tape set gripper 174 is able to grip both ends of the tape set TS or TS2 in the Y-axis directions.

The rotating mechanism 172 is rotatable about its own central axis either clockwise or counterclockwise as viewed along the Y-axis directions. When rotated, the rotating mechanism 172 places the tape set gripper 174 selectively in a first gripping position P1 where the tape set gripper 174 can grip the tape set TS pulled out from the first storage unit 11, a second gripping position P2 where the tape set gripper 174 can grip the tape set TS2 pulled out from the second storage unit 12, and a releasing position P3 where the tape set gripper 174 can release the tape set TS or TS2 after the tape set TS or TS2 has been gripped by the delivery unit 2.

The sliding mechanism 175 includes a base 175a extending in the X-axis directions, a slider 175b slidably movable in the X-axis directions along the base 175a, and a ball screw mechanism, not illustrated, for moving the slider 175b along the base 175a. When the slider 175b slidably moves in the X-axis directions along the base 175a, the rotating mechanism 172 and the tape set gripper 174 slide in the X-axis directions in unison therewith.

The delivery unit 2 includes at least a drive roller 21, two driven rollers 22 disposed opposite each other in Z-axis directions one on each side of the drive roller 21, and a moving mechanism 23 for moving the drive roller 21 and the driven rollers 22 relatively toward and away from each other in the X-axis directions. The moving mechanism 23 includes a guide rail 231 extending in the X-axis directions and a movable unit 232 movable in the X-axis directions along the guide rail 231. The movable unit 232 has an arm that is substantially U-shaped as viewed along the Y-axis directions, with the two driven rollers 22 being rotatably supported on respective distal ends of the arm. When the movable unit 232 moves along the guide rail 231, the drive roller 21 and the two driven rollers 22 move relatively toward and away from each other in the X-axis directions.

As illustrated in FIG. 2, the tape mounter 1 includes the peel plate 50 for bending the tape set TS or TS2 reeled out of the tape roll to peel off one at a time of the circular tapes T2 from the protective film T1. The peel plate 50 extends in the Y-axis directions over a distance equal to or larger than a width of the tape set TS or TS2, i.e., a length thereof in the Y-axis directions. The peel plate 50 is disposed opposite an affixing roller 59 for pressing and affixing the tape T2 to the workpiece W. The peel plate 50 is disposed on a movable member 52 movably mounted on an obliquely extending base rail 51. The peel plate 50 has a lower tip end rounded to prevent damage to the tape set TS or TS2 when in contact therewith. The movable member 52 is reciprocably movable obliquely up and down along the base rail 51. When the movable member 52 is moved along the base rail 51 to a lower end thereof, the peel plate 50 presses the protective film T1 of the tape set TS or TS2 to bend the protective film T1 into an acute-angle shape, thereby peeling off the circular tape T2 from the protective film T1 of the tape set TS or TS2 delivered from the delivery unit 2.

The base rail 51 is angularly movable about its own central axis along the Y-axis directions. When the base rail 51 is angularly moved through a certain angle, an angle at which the peel plate 50 intersects with the tape set TS or TS2 is changed.

The holding unit 3 is disposed in a position below the affixing roller 59 for holding the workpiece W and the ring frame F. The holding unit 3 includes a ring frame holder 30 that is of an annular shape as viewed in plan. The ring frame holder 30 has an upper surface made of a porous material or the like and acting as a holding surface held in fluid communication with a suction source, not illustrated.

The holding unit 3 also includes a workpiece holder 31 for holding the workpiece W substantially coaxially thereon. The workpiece holder 31 is surrounded by the ring frame holder 30 and disposed in the opening of the ring frame F. The workpiece holder 31 is of a circular shape as viewed in plan. The workpiece holder 31 has an upper surface made of a porous material or the like and acting as a holding surface held in fluid communication with a suction source, not illustrated.

The workpiece holder 31 and the ring frame holder 30 are supported on a support base 32 illustrated in FIG. 2 that is disposed below the workpiece holder 31 and the ring frame holder 30. The support base 32 is disposed on a holding unit moving mechanism 34 by which the holding unit 3 is reciprocably movable in the X-axis directions through the support base 32. The holding unit moving mechanism 34 includes a base 341 extending in the X-axis directions, a movable base table 342 movable in the X-axis directions along the base 341, and a ball screw mechanism or the like, not illustrated, for moving the movable base table 342 along the base 341.

The holding unit 3 may be vertically movable in the Z-axis directions by a holding unit lifting and lowering mechanism, not illustrated.

The affixing roller 59 for pressing and affixing the tape T2 to the workpiece W is rotatable about its own central axis along the Y-axis directions and disposed above the holding unit 3. The affixing roller 59 has an axial length along the Y-axis directions that is equal to or larger than at least the diameter of the circular tapes T2 of the tape set TS or TS2. The affixing roller 59 is vertically movable in the Z-axis directions toward and away from the holding unit 3 by an affixing roller positioning mechanism 58 in the form of a cylinder mechanism or the like, for example.

Both or either one of the holding unit 3 and the affixing roller 59 may be reciprocally movable in the Z-axis directions.

As illustrated in FIG. 2, a tape set takeover unit 76 for taking over the tape set TS or TS2 from the tape set gripper 174 is reciprocably movable in the X-axis directions by a sliding mechanism 71. The sliding mechanism 71 is disposed above a path along which the holding unit 3 is movable. The sliding mechanism 71 includes a base 710 extending in the X-axis directions, a slider 711 slidably movable in the X-axis directions along the base 710, and a ball screw mechanism, not illustrated, for moving the slider 711 along the base 710. The tape set takeover unit 76 is fixed to the slider 711.

The tape set takeover unit 76 includes a support member 761 having a bent shape and a tape set gripper 762 in the form of a clamp or the like disposed on an upper end of the support member 761. The tape set gripper 762 is able to take over and grip both ends of the tape set TS or TS2 in the Y-axis directions that is gripped by the tape set gripper 174 of the tape set transfer unit 17.

A protective film delivery unit 77 for gripping the protective film T1 from which the tape T2 has been peeled off and delivering the protective film T1 in a −X direction by way of roller rotation is disposed above a path along which the tape set takeover unit 76 is movable. The protective film delivery unit 77 includes at least a drive roller 771, two driven rollers 772 disposed opposite each other in X-axis directions one on each side of the drive roller 771, and a moving mechanism 773 for moving the drive roller 771 and the driven rollers 772 relatively toward and away from each other in the Z-axis directions. The moving mechanism 773 includes a guide rail 773a extending in the Z-axis directions and a movable unit 773b movable in the Z-axis directions along the guide rail 773a. The movable unit 773b is substantially U-shaped as viewed in side elevation, with the two driven rollers 772 being rotatably supported on respective upper ends thereof. When the movable unit 773b moves along the guide rail 773a, the drive roller 771 and the two driven rollers 772 move relatively toward and away from each other in the Z-axis directions.

A disposal unit 73 for disposing of the protective film T1 is disposed in a position below an end of the base 710 in the −X direction of the sliding mechanism 71 that moves the tape set takeover unit 76. The disposal unit 73 includes a take-up unit 731 for gripping both ends of the protective film T1, which has been delivered in the −X direction by the protective film delivery unit 77, in the Y-axis directions with a clamp 731a and winding up the protective film T1 into a film roll, an electric motor, not illustrated, for rotating the clamp 731a, and a disposal box 732 disposed below the take-up unit 731 for receiving the protective film T1 that has been wound up in the film roll, released and dropped from the clamp 731a.

A cutting unit 79 for cutting off the protective film T1 from which the tape T2 has been peeled off is disposed between the holding unit 3 and the disposal unit 73.

The tape set takeover unit 76 includes a film rest 762a mounted on an upper end of the tape set gripper 762, for supporting thereon the protective film T1 delivered by the protective film delivery unit 77. The film rest 762a has a clearance slot 762b defined in its upper surface for receiving therein a lower cutting edge of a film cutter 791, to be described below, of the cutting unit 79.

The cutting unit 79 includes the film cutter 791 for cutting off the protective film T1 placed on the film rest 762a of the tape set gripper 762 and a lifting and lowering mechanism 792 for lifting and lowering the film cutter 791 in the Z-axis directions.

As illustrated in FIG. 2, the tape mounter 1 includes control means 9 for controlling the tape mounter 1 in its entirety. The control means 9 that includes a central processing unit (CPU) or the like is electrically connected to the components, described above, of the tape mounter 1. For example, the control means 9 is electrically connected to the tape set transfer unit 17, the tape set takeover unit 76, etc., and controls the tape set transfer unit 17 to place the tape set gripper 174 into a desired position, i.e., one of the first gripping position P1 and the second gripping position P2 that are recognized in advance, and also controls the tape set takeover unit 76 to take over the protective film T1, e.g., to place the tape set gripper 762 into the releasing position P3, for example.

The tape mounter 1 includes a reader 94 for reading information of the tape set TS stored in the RFID 90 on the tube T3 of the tape set TS of type 1 stored in the first storage unit 11 and information of the tape set TS2 stored in the RFID 92 on the tube T33 of the tape set TS2 of type 2 stored in the second storage unit 12. In the example illustrated in FIG. 2, the reader 94 that functions as an RFID reader is disposed closely laterally of the second storage unit 12. A distance between the first storage unit 11 and the reader 94 is larger than a distance between the second storage unit 12 and the reader 94. The reader 94, and the RFID 90 positioned in the first storage unit 11 and the RFID 92 positioned in the second storage unit 12 are capable of exchanging information with each other by way of short-range wireless communication.

The reader 94 is supplied with electric power from a high-frequency (RF) power supply, not illustrated, for example, and is able to send read information to an input interface of the control means 9.

The RFID 90 and the RFID 92 according to the present embodiment are of the passive type that has no battery of their own, but is responsive to an energy of a magnetic or electric field from the reader 94 as the RFID reader. However, the RFID 90 and the RFID 92 are not limited to the passive type, but may be of the active type having a batter of their own. The RFID 90 stores at least information representing that the tape set TS wound on the tube T3 is a tape set of type 1, and the RFID 92 stores at least information representing that the tape set TS2 wound on the tube T33 is a tape set of type 2.

The tape mounter 1 includes a time measuring unit 95 for measuring a reading time spent until the reader 94 reads a radio wave representing the information of the tape set TS of type 1 generated and transmitted by the RFID 90 in response to the radio wave transmitted by the reader 94 and a reading time spent until the reader 94 reads a radio wave representing the information of the tape set TS2 of type 2 generated and transmitted by the RFID 92 in response to the radio wave transmitted by the reader 94. The time measuring unit 95 is connected to the reader 94 and can send the information of the measured reading time to the control means 9.

The control means 9 includes a storage element such as a memory that stores a mapping table 96 containing the first disposed position P11 of the first storage unit 11 corresponding to the first-mentioned reading time measured by the time measuring unit 95 and the second disposed position P22 of the second storage unit 12 corresponding to the second-mentioned reading time measured by the time measuring unit 95, for example.

The control means 9 also includes a recognizing section 97 for recognizing the reading time spent until the reader 94 reads the radio wave sent from the RFID 90 and representing the information of the tape set TS of type 1 in the tape roll stored in the first storage unit 11, recognizing the reading time spent until the reader 94 reads the radio wave sent from the RFID 92 and representing the information of the tape set TS2 of type 2 in the tape roll stored in the second storage unit 12, and recognizing the positions of the first storage unit 11 and the second storage unit 12, type 1 of the tape set TS stored in the first storage unit 11, and type 2 of the tape set TS2 stored in the second storage unit 12 by checking the mapping table 96, for example.

An example of operation of the tape mounter 1 will be described below.

First, the operator selects processing conditions for affixing the tape T2 to the workpiece W and the ring frame F, i.e., tape affixing processing conditions, and enters the selected tape affixing processing conditions into the control means 9 via an input apparatus, not illustrated, such as a touch panel or a keyboard combined with the tape mounter 1. The processing conditions include a combination of items of information that represent the type of the tape set to be used, the pressing force of the affixing roller 59 that matches the type of the tape set to be used, the rate at which the tape set is to be fed from the corresponding storage unit, etc. In the present example, it is assumed that the tape set desired to be used that has been set in the control means 9 by the operator is the tape set TS of type 1.

When the processing conditions are entered into the control means 9 illustrated in FIG. 2, the RF power supply, not illustrated, supplies RF electric power for magnetic resonance to the reader 94. Since the RFID 90 in the first storage unit 11 and the RFID 92 in the second storage unit 12 are positioned in a wireless field, i.e., a magnetic field in the present embodiment, of the reader 94, the reader 94 sends from its antenna respective radio waves to the RFID 90 in the first storage unit 11 and the RFID 92 in the second storage unit 12. In response to the radio waves from the reader 94, respective antennas of the RFID 90 in the first storage unit 11 and the RFID 92 in the second storage unit 12 generate electric power, causing the RFID 90 in the first storage unit 11 and the RFID 92 in the second storage unit 12 to energize their control circuits, memories, etc. to send information of the tape set TS of type 1 and the tape set TS2 of type 2.

Figure 3:
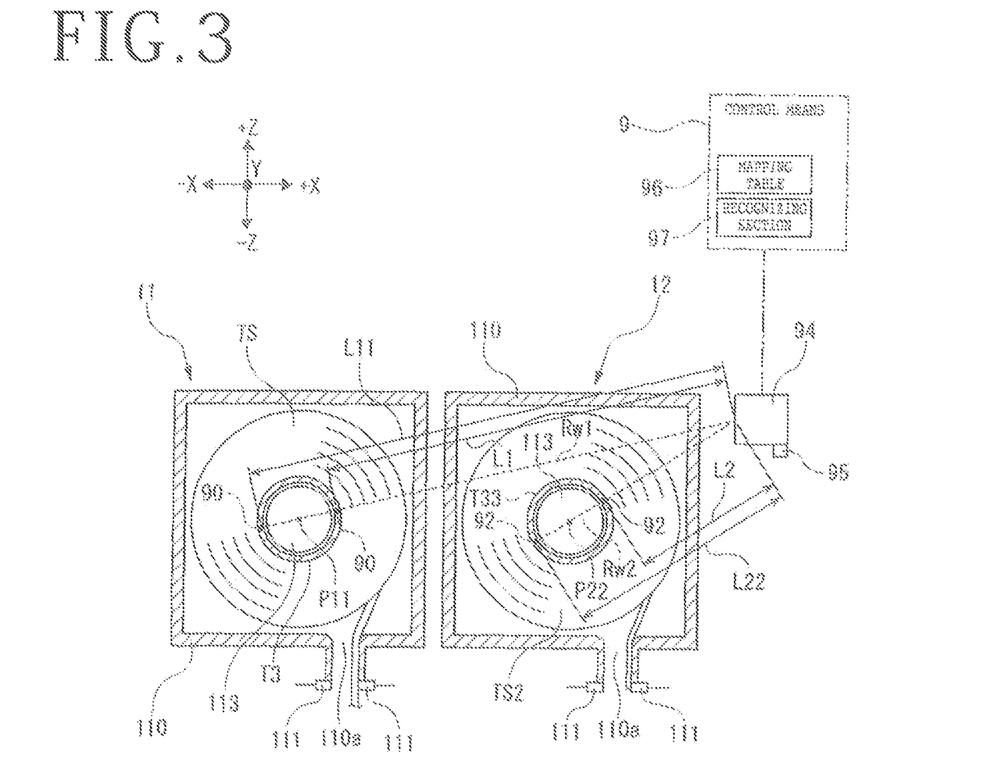
FIG. 3 is a schematic cross-sectional view illustrating a manner in which a reader reads radio waves representing information of a tape set of type 1 in a first storage unit and a tape set of type 2 in a second storage unit, generated and sent by an RFID in the first storage unit and an RFID in the second storage unit in response to radio waves transmitted from the reader.

FIG. 3 schematically illustrates in cross section the manner in which the reader 94 reads radio waves representing information of the tape set TS of type 1 in the first storage unit 11 and the tape set TS2 of type 2 in the second storage unit 12, generated and sent by the RFID 90 in the first storage unit 11 and the RFID 92 in the second storage unit 12 in response to the radio waves transmitted from the reader 94.

As illustrated in FIG. 3, a situation where the RFID 90 or the RFID 92 as the RF tag and the reader 94 are spaced from each other by a shortest distance, and a situation where the RFID 90 or the RFID 92 as the RF tag and the reader 94 are spaced from each other by a longest distance, for example, will be described below. In other words, a situation where a radio wave Rw1 or a radio wave Rw2 generated by the reader 94 is transmitted as hypothetically indicated by the broken line to travel through the center of the rotatable tube T3 or T33 and reach the RFID 90 or 92, and a situation where the radio wave Rw1 or the radio wave Rw2 generated by the reader 94 is transmitted as hypothetically indicated by the broken line to reach the RFID 90 or 92 without traveling through the center of the rotatable tube T3 or T33 will be described below.

It is assumed that the shortest distance between the RFID 90 in the first storage unit 11 and the reader 94 is denoted by L1 and the longest distance between the RFID 90 and the reader 94 is denoted by L11. For example, the distance L1 is 0.55 m and the distance L11 is 0.627 m.

Furthermore, it is assumed that the radio wave generated and transmitted by the reader 94 and the radio wave generated and transmitted by the RFID 90 and representing the information of the tape set TS, i.e., the information indicating the tape set TS of type 1 travel at a speed C of 299792458 m/sec.

Time t1 spent after the reader 94 has generated and transmitted the radio wave over an outward path to the RFID 90 spaced by the distance L1 until the reader 94 receives the radio wave generated by RFID 90 and transmitted over a return path therefrom and reads the information of the tape set TS of type 1 is $t1=(0.55 \text{ m}/C) \times 2=3.669 \times 10^{-9}$ sec. Moreover, time t11 spent after the reader 94 has generated and transmitted the radio wave over an outward path to the RFID 90 spaced by the distance L11 until the reader 94 receives the radio wave generated by the RFID 90 and transmitted over a return path therefrom and reads the information of the tape set TS is $t11=(0.627 \text{ m}/C) \times 2=4.183 \times 10^{-9}$ sec.

Consequently, a reading time t13 measured by the time measuring unit 95 connected to the reader 94 is represented by a period of time in the range from $3.669 \times 10^{-9}$ to $4.183 \times 10^{-9}$ sec.

It is assumed that the shortest distance between the RFID 92 in the second storage unit 12 and the reader 94 is denoted by L2 and the longest distance between the RFID 92 and the reader 94 is denoted by L22. For example, the distance L2 is 0.300 m and the distance L22 is 0.377 m.

Time t2 spent after the reader 94 has generated and transmitted the radio wave to the RFID 92 spaced by the distance L2 until the reader 94 receives the radio wave generated by RFID 92 and transmitted therefrom and reads the information of the tape set TS2 of type 2 is $t2=(0.300 \text{ m}/C) \times 2=2.001 \times 10^{-9}$ sec. Moreover, time t22 spent after the reader 94 has generated and transmitted the radio wave to the RFID 92 spaced by the distance L22 until the reader 94 receives the radio wave generated by the RFID 92 and transmitted therefrom and reads the information of the tape set TS2 is $t22=(0.377 \text{ m}/C) \times 2=2.515 \times 10^{-9}$ sec.

Consequently, a reading time t23 measured by the time measuring unit 95 connected to the reader 94 is represented by a period of time in the range from $2.001 \times 10^{-9}$ to $2.515 \times 10^{-9}$ sec.

The reader 94 sends to the control means 9 the information of the RFID 90, i.e., the information of the tape set TS of type 1, read by the reader 94, the information of the RFID 92, i.e., the information of the tape set TS2 of type 2, read by the reader 94, the reading time t13, i.e., the period of time in the range from $3.669 \times 10^{-9}$ to $4.183 \times 10^{-9}$ sec., spent until the reader 94 receives the radio wave transmitted from the RFID 90 and reads the information of the RFID 90 and measured by the time measuring unit 95, and the reading time t23, i.e., the period of time in the range from $2.001 \times 10^{-9}$ to $2.515 \times 10^{-9}$ sec., spent until the reader 94 receives the radio wave transmitted from the RFID 92 and reads the information of the RFID 92 and measured by the time measuring unit 95.

Figure 4:
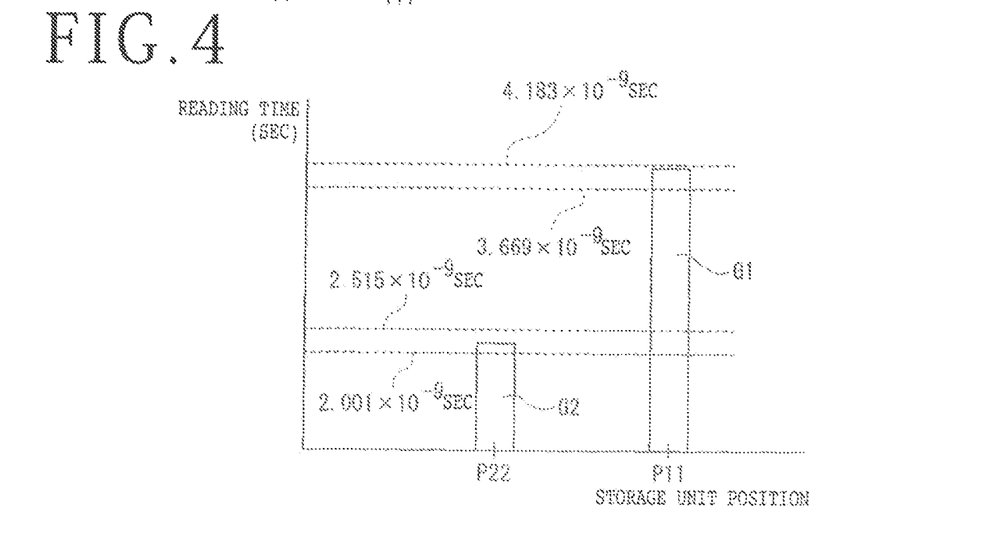
FIG. 4 is a bar graph illustrating a reading time spent until the reader receives the transmitted radio waves and reads the information represented thereby after the radio waves have been generated and transmitted by the RFID in the first storage unit and the RFID in the second storage unit in response to the radio waves transmitted from the reader.

The reading time t13 spent until the reader 94 receives the radio wave transmitted from the RFID 90 in response to the radio wave transmitted by the reader 94 and reads the information of the RFID 90, i.e., the information of the tape set TS of type 1, is indicated by a bar G1 in a bar graph illustrated in FIG. 4. The reading time t23 spent until the reader 94 receives the radio wave transmitted from the RFID 92 in response to the radio wave transmitted by the reader 94 and reads the information of the RFID 92, i.e., the information of the tape set TS2 of type 2, is indicated by a bar G2 in the bar graph. It can be seen from FIG. 4 that the closer the RFID is to the reader 94, the shorter the reading time is. The transmission of the radio waves from the reader 94 to the RFIDs 90 and 92 is timed such that the reading time t13 and the reading time t23 will not overlap each other.

Figure 5:
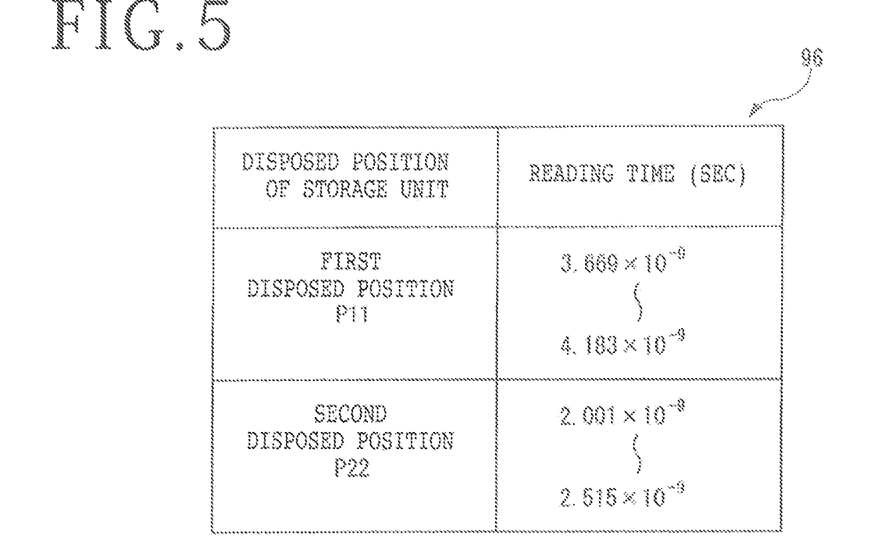
FIG. 5 is a mapping table of positions of the first and second storage units that correspond to the reading times.

The recognizing section 97 of the control means 9 checks the reading time t13 spent until the reader 94 receives the radio wave from the RFID 90 and reads the information that the tape set TS is of type 1 from the radio wave from the RFID 90 on the tube T3 on which the tape set TS is wound as the tape roll, against the mapping table 96 illustrated in FIG. 5, and recognizes that the storage unit storing the RFID 90 therein, i.e., the storage unit storing the tape set TS of type 1 therein, is the first storage unit 11 disposed in the first disposed position P11.

Furthermore, the recognizing section 97 checks the reading time t23 spent until the reader 94 receives the radio wave from the RFID 92 and reads the information that the tape set TS2 is of type 2 from the radio wave from the RFID 92 on the tube T33 on which the tape set TS2 is wound as the tape roll, against the mapping table 96 illustrated in FIG. 5, and recognizes that the storage unit storing the RFID 92 therein, i.e., the storage unit storing the tape set TS2 of type 2 therein, is the second storage unit 12 disposed in the second disposed position P22.

In the present example, since the tape set desired to be used that has been set in the control means 9 by the operator is the tape set TS of type 1, when the recognizing section 97 recognizes that the tape set TS of type 1 is stored in the first storage unit 11 as described above, the control means 9 controls the tape set transfer unit 17 to start to pull out the tape set TS of type 1 from the first storage unit 11, as illustrated in FIG. 2. Specifically, the control means 9 controls the rotating means 114 to rotate the tape set TS of type 1 in the tape roll in the first storage unit 11 in a normal direction, i.e., clockwise as viewed from the viewer of FIG. 2, threading the tape set TS of type 1 in the web shape through the opening 110a and between the guide rollers 14, which guide the tape set TS to travel downwardly. The rotating mechanism 172 and the sliding mechanism 175 of the tape set transfer unit 17 position the tape set gripper 174 into the first gripping position P1. In the first gripping position P1, the tape set gripper 174 grips both ends in the Y-axis directions of the leading end of the tape set TS of type 1 delivered from the guide rollers 14.

The sliding mechanism 175 then moves the tape set gripper 174 that is gripping the tape set TS of type 1 in a +X direction from the position below the first storage unit 11, pulling out of the tape set TS of type 1 further from the first storage unit 11. The rotating mechanism 172 is rotated clockwise, for example, to cause the tape set TS of type 1 gripped by the tape set gripper 174 to be placed around the guide roller 15, and to thread the tape set TS of type 1 between the drive roller 21 and the driven rollers 22 of the delivery unit 2 while placing the tape set TS of type 1 around the drive roller 21. The rotating mechanism 172 is further rotated clockwise to move the tape set gripper 174 to the releasing position P3.

Next, the slider 711 of the sliding mechanism 71 slides in the +X direction, for example, moving the tape set gripper 762 of the tape set takeover unit 76 to the releasing position P3. When the tape set gripper 174 releases the tape set TS of type 1 in the releasing position P3, the tape set gripper 762 takes over and grips both ends in the Y-axis directions of the end of the tape set TS of type 1. The sliding mechanism 71 moves the tape set gripper 762 in the −X direction, pulling the tape set TS of type 1 gripped by the tape set gripper 762 until the tape set TS of type 1 passes between the drive roller 771 and the driven rollers 772 of the protective film delivery unit 77 and is led to the take-up unit 731 of the disposal unit 73. The clamp 731a of the take-up unit 731 then grips both ends in the Y-axis directions of the end of the tape set TS of type 1.

The moving mechanism 23 of the delivery unit 2 moves the two driven rollers 22 closely to the drive roller 21, causing the drive roller 21 and the driven rollers 22 to sandwich the tape set TS of type 1 therebetween in the X-axis directions. The moving mechanism 773 of the protective film delivery unit 77 moves the two driven rollers 772 closely to the drive roller 771, causing the drive roller 771 and the driven rollers 772 to sandwich the tape set TS of type 1 therebetween in the Z-axis directions.

As described above, the tape mounter 1 according to the present embodiment includes the first storage unit 11 and the second storage unit 12 that have the respective shafts 113 inserted in the respective tubes T3 and T33 on which there are wound the tape sets TS and TS2 as the tape rolls, each including the tape T2 having the base T51 corresponding in shape to the workpiece W and the adhesive layer T52 disposed on a surface of the base T51, and the elongate protective film T1 for protecting the adhesive layer T52, the tape sets TS and TS2 wound as the tape rolls having the RFID 90 and the RFID 92, respectively, disposed on the respective tubes T3 and T33 and storing information of the tape sets TS and TS3, the reader 94 for reading the information of the tape TS of type 1 and the information of the tape TS2 of type 2 that are stored in the RFID 90 and the RFID 92, respectively, the first storage unit 11 and the second storage unit 12 being disposed such that they are spaced from the reader 94 by respective different distances, the time measuring unit 95 for measuring a reading time spent until the reader 94 receives the radio wave representing the information of the tape set TS of type 1 generated and transmitted by the RFID 90 in response to the radio wave transmitted by the reader 94 and a reading time spent until the reader 94 receives the radio wave representing the information of the tape set TS2 of type 2 generated and transmitted by the RFID 92 in response to the radio wave transmitted by the reader 94, the mapping table 96 containing the first disposed position P11 of the first storage unit 11 corresponding to the first-mentioned reading time and the second disposed position P22 of the second storage unit 12 corresponding to the second-mentioned reading time, and the recognizing section 97 for checking, against the mapping table 96, the reading time spent until the reader 94 receives the radio wave representing the information of the tape set TS and transmitted from the RFID 90 of the tape set TS as the tape roll stored in the first storage unit 11 and the reading time spent until the reader 94 receives the radio wave representing the information of the tape set TS2 and transmitted from the RFID 92 of the tape set TS2 as the tape roll stored in the second storage unit 12, and recognizing the first disposed position P11 of the first storage unit 11, the second disposed position P22 of the second storage unit 12, type 1 of the tape set TS stored in the first storage unit 11, and type 2 of the tape set TS2 stored in the second storage unit 12. Simply with the operator setting processing conditions for affixing the tape in the tape mounter 1, the tape mounter 1 can operate on its own to recognize a tape set of the same type as the tape type included in the processing conditions among the first and second storage units 11 and 12, and move the tape set gripper 174 of the tape set transfer unit 17 to the first storage unit 11 or the second storage unit 12 in which the tape set has been recognized, causing the tape set gripper 174 to place the recognized tape set in position in the tape mounter 1. Consequently, the operator is not required to grasp the types of the tape sets TS and TS2 stored in the first and second storage units 11 and 12 and the first and second disposed positions P11 and P22 of the first and second storage units 11 and 12. Since it is possible for the tape mounter 1 to switch to the tape set of the tape type included in desired processing conditions without requiring the operator to specify the position of the storage unit that stores the tape set, the operator is able to work more efficiently and is less subjected to burdens at work.

The workpiece W is placed on the workpiece holder 31 substantially coaxially therewith, and the ring frame F is placed on the ring frame holder 30. Then, the suction sources, not illustrated, are actuated to hold the workpiece W under suction on the holding surface of the workpiece holder 31 and also to hold the ring frame F under suction on the holding surface of the ring frame holder 30.

The holding unit moving mechanism 34 moves the holding unit 3 in the X-axis directions to bring the ring frame holder 30 that holds the ring frame F into a position directly below the affixing roller 59. Thereafter, the affixing roller 59 is lowered to a position where the tape T2 will be affixed to the ring frame F held by the ring frame holder 30.

The movable member 52 moves to the lower end of the base rail 51, causing a tip end of the peel plate 50 to contact and press the protective film T1 of the tape set TS of type 1 until the tape set TS of type 1 is bent into an acute-angle shape with the protective film T1 on the inside of the tape set TS. The tape T2 is thus peeled off from the tape set TS of type 1 and delivered to a position below the affixing roller 59.

With the tape T2 placed along a circumferential surface of the affixing roller 59, the affixing roller 59 is rotated at a predetermined rotational speed while pressing the tape T2 against the ring frame F held by the ring frame holder 30 from one side of the ring frame F. Furthermore, the holding unit moving mechanism 34 moves the ring frame holder 30 and the workpiece holder 31 at a predetermined speed in the −X direction, whereupon the affixing roller 59 as it is rotating presses the tape T2 against the workpiece W and the ring frame F. At this time, the delivery unit 2 rotates the drive roller 21 at a predetermined rotational speed, causing the two driven rollers 22 to rotate in unison with the drive roller 21 to guide the tape set TS of type 1 downwardly toward the holding unit 3. The protective film delivery unit 77 rotates the drive roller 771 at a predetermined rotational speed, causing the two driven rollers 772 to rotate in unison with the drive roller 771 to guide the protective film T1 from which the tape T2 has been peeled off by the peel plate 50 from the peel plate 50 to the disposal unit 73.

While the affixing roller 59 is pressing the tape T2 against the workpiece W and the ring frame F, the holding unit 3 is moved in the −X direction to a predetermined position beyond the position below the affixing roller 59. The single tape T2 is now affixed to the workpiece W and the ring frame F.

The protective film T1 from which the tape T2 has been peeled off is delivered to the disposal unit 73 by the protective film delivery unit 77. The protective film T1 is then wound into a film roll by the take-up unit 731 that is rotated by the electric motor, not illustrated. After the take-up unit 731 has formed the film roll of a predetermined length of the protective film T1, the clamp 731a releases the film roll, which is discarded into the disposal box 732.

The workpiece W that is integrally combined with the ring frame F by the tape T2 is transported by a feed mechanism, not illustrated, to a dicing apparatus or the like where the workpiece W is diced or otherwise processed. When the operation of affixing the tape T2 to the workpiece W has been completed, new workpieces W are successively fed to the workpiece holder 31 and new ring frames F are successively fed to the ring frame holder 30, after which tapes T2 are repeatedly affixed to the workpieces W and the protective film T1 from which the tapes T2 are peeled off is repeatedly wound into a film roll.

As the tape set TS is continuously pulled from the tape roll in the first storage unit 11 illustrated in FIG. 2, the tape roll in the first storage unit 11 is gradually reduced in diameter.

When the type of the tape set to be used in the tape mounter 1 is to be changed from type 1 to type 2, for example, the control means 9 controls the tape set transfer unit 17 to select the tape set TS2 of type 2 and pull the tape set TS2 out of the second storage unit 12. Specifically, the operator selects processing conditions for affixing tapes T2 of the tape set TS2 of type 2 to workpieces W and ring frames F, and enters the selected tape affixing processing conditions into the control means 9 via the input apparatus, not illustrated. In the same manner as described above, the reader 94 generates and transmits radio waves, and the time measuring unit 95 measures a reading time spent until the reader 94 receives radio waves generated and transmitted by the RFID 90 and the RFID 92 in response to the radio waves transmitted by the reader 94 and reads the information of the tape sets TS and TS2 of types 1 and 2 from the radio waves from the RFID 90 and the RFID 92, and the recognizing section 97 of the control means 9 checks the reading times spent until the reader 94 receives the radio waves from the RFID 90 and the RFID 92 and reads the information of the tape sets TS and TS2 of types 1 and 2 from the radio waves from the RFID 90 and the RFID 92, against the mapping table 96, and recognizes the second disposed position P22 of the second storage unit 12 that stores the desired tape set TS2 of type 2 and type 2 of the tape set TS2 stored in the second storage unit 12. The control means 9 controls the tape set transfer unit 17 to move the tape set gripper 174 to the second gripping position P2 below the recognized second disposed position P22 of the second storage unit 12, where the tape set gripper 174 can place the tape set TS2 of type 2 from the second storage unit 12 in position in the tape mounter 1. Consequently, the operator is not required to grasp the types of the tape set TS2 stored in the second storage unit 12 and the second disposed position P22 of the second storage unit 12. Since it is possible for the tape mounter 1 to switch from the tape set TS of type 1 to the tape set TS2 of type 2 without requiring the operator to specify the position of the second storage unit 12, the operator is able to work more efficiently and is less subjected to burdens at work.

When the tape set to be used in the tape mounter 1 is to switch to the tape set TS2 of type 2, before the tape set TS2 of type 2 is pulled out from the second storage unit 12, the cutting unit 79 cuts off the protective film T1 of the tape set TS of type 1 that is in current use, and the disposal unit 73 winds the cut-off protective film T1 into a film roll and discards the film roll.

The film rest 762a of the tape set takeover unit 76 is positioned in advance below the cutting unit 79, and the protective film T1 is placed on the film rest 762a. The lifting and lowering mechanism 792 lowers the film cutter 791 of the cutting unit 79 in a −Z direction, for example, forcing the cutting edge of the film cutter 791 across the protective film T1 into the clearance slot 762b to completely cut off the protective film T1 ahead of the film rest 762a. The cut-off protective film T1 is wound into a film roll by the take-up unit 731 of the disposal unit 73.

Thereafter, the film cutter 791 is lifted in the +Z direction and retracted away from the film rest 762a, and the film roll of the protective film T1 is discarded into the disposal box 732 by the disposal unit 73. At this time, the rotating means 114 rotates the shaft 113 in the first storage unit 11 that is in current use, in a reverse direction, i.e., counterclockwise as viewed from the viewer of FIG. 2, winding back the remaining tape set TS of type 1 around the shaft 113 in the first storage unit 11. Specifically, the tape set TS of type 1 that has been pulled toward the holding unit 3 is pulled back to travel between the drive roller 771 and the driven rollers 772 of the protective film delivery unit 77 and between the drive roller 21 and the driven rollers 22 of the delivery unit 2 and through the opening 110a in the case 110 of the first storage unit 11, and is wound around the shaft 113. When the leading end detector 111 detects the protective film T1, the rotating means 114 stops rotating the shaft 113. Thereafter, in the same manner as described above, the tape set TS2 of type 2 is placed in position in the tape mounter 1 by the tape set gripper 174, etc. such that tapes T2 from the tape set TS2 of type 2 can be affixed to workpieces W and ring frames F.

The tape mounter according to the present invention is not limited to the tape mounter 1 according to the embodiment described above. The tape mounter 1 is not limited to the details illustrated in the drawings, but may be changed and modified within the scope of the present invention.

Figure 6:
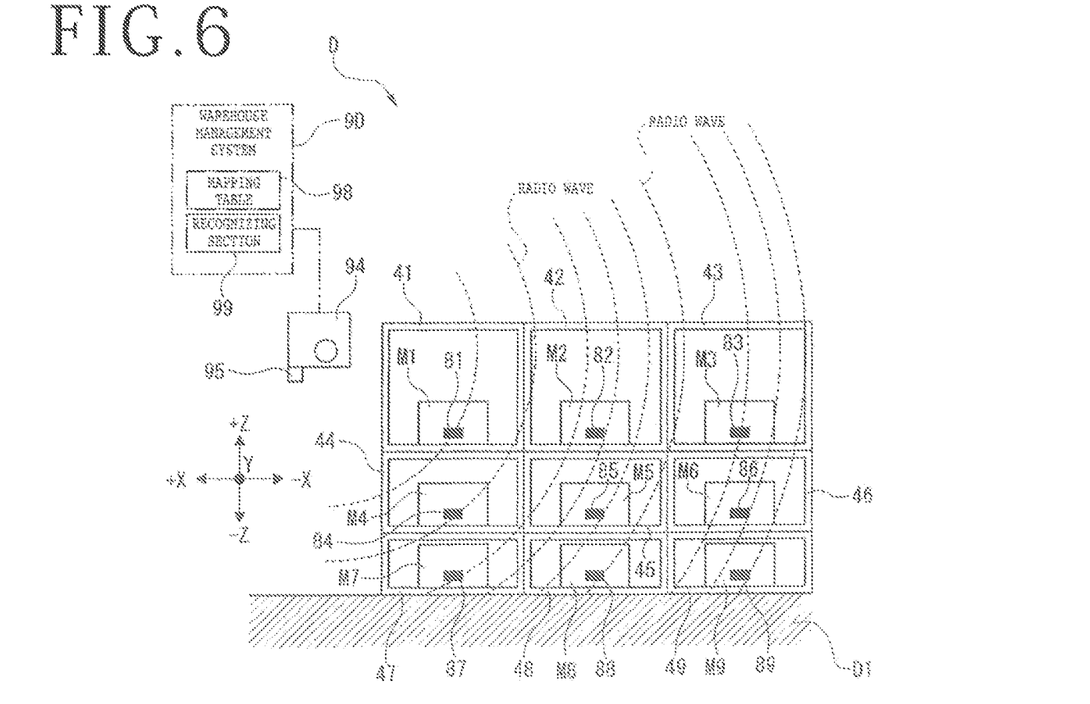
FIG. 6 is a schematic elevational view illustrating a merchandise management warehouse according to an embodiment of the present invention.

Merchandise Management Warehouse:

As illustrated in FIG. 6, a merchandise management warehouse D according to an embodiment of the present invention includes a plurality of (nine in FIG. 6) boxes 41 through 49 storing therein respective pieces M1 through M9 of merchandise with respective RFIDs 81 through 89 attached thereto, and a reader 94 for reading information of the RFIDs 81 through 89.

The boxes 41 through 49 should preferably be made of a synthetic resin or the like that does not obstruct wireless communication, for example. According to the embodiment illustrated in FIG. 6, the boxes 41 through 49 are stacked one on another on a floor D1 of the merchandise management warehouse D. Rather than being stacked as illustrated in FIG. 6, the boxes 41 through 49 may be placed on respective shelves, not illustrated, disposed in a picking facility, for example. The shelves in the picking facility may be spaced at given intervals therebetween that provide passageways for the operator to walk therethrough in the merchandise management warehouse D.

Regardless of whether the boxes 41 through 49 are stacked directly on the floor D1 or placed in the respective shelves, not illustrated, the RFIDs 81 through 89 attached as RF tags to the pieces M1 through M9 of merchandise stored in the boxes 41 through 49 are spaced from the reader 94 by respective different distances.

The merchandise management warehouse D is managed by a warehouse management system 9D including a CPU, etc. The reader 94 is mounted on a ceiling or wall of the merchandise management warehouse D. The reader 94 is supplied with electric power from a high-frequency (RF) power supply, not illustrated, for example, and is able to exchange information with the RFIDs 81 through 89 by way of short-range wireless communication based on radio waves, e.g., electromagnetic waves, spreading throughout the merchandise management warehouse D. The reader 94 can transmit read information to the warehouse management system 9D that is electrically connected to the reader 94. The RFIDs 81 through 89 store information of the pieces M1 through M9 of merchandise.

A time measuring unit 95 is connected to the reader 94. The time measuring unit 95 measures a reading time spent until the reader 94 receives radio waves generated and transmitted from the RFIDs 81 through 89 in response to the radio waves transmitted by the reader 94 and representing the information of the pieces M1 through M9 of merchandise in the boxes 41 through 49. The time measuring unit 95 can transmit information of the measured reading time to the warehouse management system 9D.

According to the present embodiment, the warehouse management system 9D includes a mapping table 98 containing positions of the boxes 41 through 49 corresponding to the respective reading times transmitted from the reader 94, and a recognizing section 99 for checking the reading times spent until the reader 94 receives the radio waves representing the information of the pieces M1 through M9 of merchandise from the RFIDs 81 through 89 on the pieces M1 through M9 of merchandise stored in the respective boxes 41 through 49, against the mapping table 98, and recognizing the positions of the boxes 41 through 49 and the pieces M1 through M9 (the information of the pieces M1 through M9) of merchandise stored in the respective boxes 41 through 49.

The operator selects the piece M1 of merchandise to be picked up, for example, and enters the information of the piece M1 of merchandise into the warehouse management system 9D via an input apparatus, not illustrated, of the merchandise management warehouse D or a terminal such as a smartphone of the operator that is connected to the warehouse management system 9D via a network.

When the information of the desired piece M1 of merchandise is entered into the warehouse management system 9D, the RF power supply, not illustrated, supplies RF electric power for magnetic resonance to the reader 94. Since the pieces M1 through M9 of merchandise stored in the respective boxes 41 through 49 are positioned in a wireless field of the reader 94, the reader 94 sends from its antenna respective radio waves to the RFIDs 81 through 89. In response to the radio waves from the reader 94, respective antennas of the RFIDs 81 through 89 generate electric power, causing the RFIDs 81 through 89 to generate and transmit radio waves representing the information of the pieces M1 through M9 of merchandise.

Reading times spend until the reader 94 receives the radio waves generated and transmitted by the RFIDs 81 through 89 and representing the information of the pieces M1 through M9 of merchandise are different from each other such that the closer the RFID is to the reader 94, the shorter the reading time is. The recognizing section 99 of the warehouse management system 9D checks the reading times spent until the reader 94 receives the radio waves representing the information of the pieces M1 through M9 of merchandise against the mapping table 98, and recognizes that the box 41 storing the RFID 81, i.e., the box 41 storing the piece M1 of merchandise, is closest to the reader 94 as illustrated in FIG. 6. The recognizing section 99 of the warehouse management system 9D displays the position of the piece M1 of merchandise on a monitor disposed in the merchandise management warehouse D, announces the positional information of the piece M1 of merchandise through a speaker, and/or displays the positional information of the piece M1 of merchandise on a smartphone or the like as a terminal of the operator that is connected to the warehouse management system 9D via a network. It is thus possible for the operator to quickly locate the desired piece M1 of merchandise among the pieces M1 through M9 of merchandise stored in the respective boxes 41 through 49 on the basis of the information recognized by the recognizing section 99.

The merchandise management warehouse according to the present invention is not limited to the merchandise management warehouse D according to the embodiment described above. The merchandise management warehouse D is not limited to the details illustrated in the drawings, but may be changed and modified within the scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A tape mounter for affixing a tape to a workpiece, comprising:
   at least two storage units each storing a tape set that includes a tape having a base corresponding in shape to the workpiece and an adhesive layer formed on a surface of the base, and an elongate protective film for protecting the adhesive layer, the tape set wound around a tube as a tape roll, the tube having a radio frequency identifier storing information of the tape set, each of the storage units having a shaft inserted in the tube;
   a plurality of rollers around which the tape set pulled from the tape roll stored in each of the storage units is trained to peel off the tape from the protective film before the tape is affixed to the workpiece;
   a reader for reading the information stored in the radio frequency identifier of each of the tape sets stored in the storage units, the reader being spaced from the storage units by respective different distances;
   a time measuring unit for measuring reading times spent until the reader receives radio waves generated and transmitted by the radio frequency identifiers stored in the storage units in response to radio waves generated and transmitted by the reader and reads the information of the tape sets represented by the radio waves;
   a mapping table containing positions of the storage units corresponding to the respective reading times; and
   a recognizing section for checking the reading times spent until the reader receives the radio waves representing the information of the tape sets from the radio frequency identifiers of the tape rolls stored in the respective storage units, against the mapping table, and recognizing the positions of the storage units and types of the tape sets stored in the storage units.

2. A merchandise management warehouse comprising:
   a reader for reading information of radio frequency identifiers attached to respective pieces of merchandise;
   a plurality of boxes storing the respective pieces of merchandise therein and disposed such that the radio frequency identifiers attached to the respective pieces of merchandise stored therein are spaced from the reader by respective different distances;
   a time measuring unit for measuring reading times spent until the reader receives radio waves generated and transmitted by the radio frequency identifiers in response to radio waves generated and transmitted by the reader and reads information of the pieces of merchandise represented by the radio waves generated and transmitted by the radio frequency identifiers;
   a mapping table containing positions of the boxes corresponding to the respective reading times; and
   a recognizing section for checking the reading times spent until the reader receives the radio waves representing the information of the pieces of merchandise from the radio frequency identifiers of the pieces of merchandise stored in the respective boxes, against the mapping table, and recognizing the positions of the boxes and the information of the pieces of merchandise stored in the boxes, and
   wherein the reader is maintained at a stationary position with respect to the boxes.

3. The merchandise management warehouse according to claim 2, wherein the reader is attached to a wall of the warehouse.

4. The merchandise management warehouse according to claim 2, wherein the reader is attached to a ceiling of the warehouse.

5. A merchandise management warehouse comprising:
   a reader for reading information of radio frequency identifiers attached to respective pieces of merchandise;
   a plurality of boxes storing the respective pieces of merchandise therein and disposed such that the radio frequency identifiers attached to the respective pieces of merchandise stored therein are spaced from the reader by respective different distances;
   a time measuring unit for measuring reading times spent until the reader receives radio waves generated and transmitted by the radio frequency identifiers in response to radio waves generated and transmitted by the reader and reads information of the pieces of merchandise represented by the radio waves generated and transmitted by the radio frequency identifiers;
   a mapping table containing positions of the boxes corresponding to the respective reading times; and
   a recognizing section for checking the reading times spent until the reader receives the radio waves representing the information of the pieces of merchandise from the radio frequency identifiers of the pieces of merchandise stored in the respective boxes, against the mapping table, and recognizing the positions of the boxes and the information of the pieces of merchandise stored in the boxes, and
   wherein the reader is maintained at a fixed position within the warehouse.

6. The merchandise management warehouse according to claim 5, wherein the reader is attached to a wall of the warehouse.

7. The merchandise management warehouse according to claim 5, wherein the reader is attached to a ceiling of the warehouse.

* * * * *